US007575844B2

(12) United States Patent
Kasperchik et al.

(10) Patent No.: US 7,575,844 B2
(45) Date of Patent: Aug. 18, 2009

(54) COLOR FORMING COMPOSITES CAPABLE OF MULTI-COLORED IMAGING AND ASSOCIATED SYSTEMS AND METHODS

(75) Inventors: Vladek Kasperchik, Corvallis, OR (US); Susan E. Bailey, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 59 days.

(21) Appl. No.: 11/796,349

(22) Filed: Apr. 27, 2007

(65) Prior Publication Data

US 2008/0268384 A1 Oct. 30, 2008

(51) Int. Cl.
*G03F 7/00* (2006.01)
*G03F 7/04* (2006.01)

(52) U.S. Cl. ...................... 430/138; 430/19; 430/270.1; 430/270.15; 430/321; 430/330; 430/331

(58) Field of Classification Search .................. 430/19, 430/330, 270.1, 270.15, 321, 333, 138
See application file for complete search history.

(56) References Cited

U.S. PATENT DOCUMENTS

| | | | | |
|---|---|---|---|---|
| 5,168,029 | A * | 12/1992 | Igarashi et al. | 430/138 |
| 5,180,652 | A * | 1/1993 | Yamaguchi et al. | 430/281.1 |
| 5,243,052 | A | 9/1993 | Taylor et al. | |
| 5,876,898 | A * | 3/1999 | Ikeda et al. | 430/203 |
| 6,060,233 | A | 5/2000 | Nohr et al. | |
| 6,143,480 | A | 11/2000 | Obayashi et al. | |
| 6,432,610 | B1 | 8/2002 | Rentzepis et al. | |
| 6,721,257 | B2 * | 4/2004 | Alperovich et al. | 369/108 |
| 6,835,431 | B1 * | 12/2004 | Alperovich et al. | 428/64.1 |
| 6,890,614 | B2 | 5/2005 | Gore et al. | |
| 6,958,181 | B1 | 10/2005 | Gore | |
| 7,018,953 | B2 | 3/2006 | Gore et al. | |
| 7,052,812 | B1 * | 5/2006 | Wang et al. | 430/18 |
| 7,141,360 | B2 | 11/2006 | Kasperchik et al. | |
| 7,148,182 | B2 | 12/2006 | Field et al. | |
| 7,354,884 | B2 * | 4/2008 | Hada et al. | 503/207 |
| 2004/0147399 | A1 | 7/2004 | Gore | |
| 2005/0053863 | A1 | 3/2005 | Gore | |
| 2005/0053870 | A1 | 3/2005 | Willard et al. | |
| 2005/0095540 | A1 | 5/2005 | Sakizadeh et al. | |
| 2005/0137088 | A1 | 6/2005 | Hayakawa et al. | |
| 2005/0226130 | A1 * | 10/2005 | Peeters et al. | 369/125 |
| 2005/0274274 | A1 | 12/2005 | Gore et al. | |
| 2006/0009356 | A1 | 1/2006 | Muryama et al. | |
| 2006/0068315 | A1 | 3/2006 | Gore | |
| 2006/0093958 | A1 | 5/2006 | Kasperchik et al. | |
| 2006/0147833 | A1 | 7/2006 | Kasperchik et al. | |
| 2007/0053279 | A1 * | 3/2007 | Magnitskii et al. | 369/275.1 |
| 2007/0077522 | A1 * | 4/2007 | Satoh et al. | 430/270.11 |
| 2007/0238045 | A1 * | 10/2007 | Brocklin et al. | 430/270.1 |
| 2007/0243354 | A1 * | 10/2007 | Bailey et al. | 428/64.6 |

FOREIGN PATENT DOCUMENTS

JP 07-94496 B2 10/1995

OTHER PUBLICATIONS

International Search Report; PCT Patent Application No. PCT/US2008/061627, filed Apr. 25, 2008; search issued by Korean Patent Office (ISA) Sep. 22, 2008.

* cited by examiner

*Primary Examiner*—Amanda C. Walke

(57) ABSTRACT

Composites, methods, and systems for production of multi-color images which are developable at various wavelengths are disclosed and described. The color forming composite can include a first color forming layer having a first polymer matrix, a first color former, and a first developer where the first color former and the first developer can be in separate phases within the first color forming layer; a second color forming layer having a second polymer matrix, a second color former, and a second developer where the second color former and the second developer can be in separate phases within the second color forming layer; and at least one radiation absorber. The radiation absorber can be present in at least one of the first or second color forming layers. Additionally, the first color forming layer can have a first extinction coefficient that is higher than the second extinction coefficient of the second color forming layer.

24 Claims, No Drawings

COLOR FORMING COMPOSITES CAPABLE OF MULTI-COLORED IMAGING AND ASSOCIATED SYSTEMS AND METHODS

BACKGROUND OF THE INVENTION

Compositions which produce a color change upon exposure to energy in the form of light or heat are of great interest in producing images on a variety of substrates. Optical disks represent a significant percentage of the market for data storage of software as well as of photographic, video, and/or audio data. Typically, optical disks have data patterns embedded thereon that can be read from and/or written to one side of the disk, and a graphic display or label printed on the other side of the disk.

In order to identify the contents of the optical disk, printed patterns or graphic display information can be provided on the non-data, or label, side of the disk. The patterns or graphic display can be both decorative and provide pertinent information about the data content of the disk. In the past, commercial labeling has been routinely accomplished using screen-printing methods. While this method can provide a wide variety of label content, it tends to be cost ineffective for production of less than about 400 customized disks because of the fixed costs associated with preparing a stencil or combination of stencils and printing the desired pattern or graphic display.

In recent years, the significant increase in the use of optical disks for data storage by consumers has increased the demand to provide customized labels to reflect the content of the optical disk. Most consumer available methods of labeling are limited to either handwritten descriptions which lack professional appearance, quality and variety, or preprinted labels which may be affixed to the disk, but which can also adversely affect the disk performance upon spinning at high speeds.

Recently, color forming compositions have been developed which can be developed using energy sources such as lasers in order to form an image. However, these color forming compositions are often useful for only very specific applications and have a limited color palette. For this and other reasons, the need still exists for color forming compositions and composites which increase the available options for such imaging systems.

DETAILED DESCRIPTION OF THE PREFERRED EMBODIMENT(S)

Reference will now be made to exemplary embodiments and specific language will be used herein to describe the same. It will nevertheless be understood that no limitation of the scope of the invention is thereby intended. Alterations and further modifications of the inventive features described herein and additional applications of the principles of the invention as described herein, which would occur to one skilled in the relevant art and having possession of this disclosure, are to be considered within the scope of the invention. Further, before particular embodiments of the present invention are disclosed and described, it is to be understood that this invention is not limited to the particular process and materials disclosed herein as such may vary to some degree. It is also to be understood that the terminology used herein is used for the purpose of describing particular embodiments only and is not intended to be limiting, as the scope of the present invention will be defined only by the appended claims and equivalents thereof.

In describing and claiming the present invention, the following terminology will be used.

The singular forms "a," "an," and "the" include plural referents unless the context clearly dictates otherwise. Thus, for example, reference to "a radiation absorber" includes reference to one or more of such materials.

As used herein, the term "color forming composite" or "color forming layered composite" refers to a composite having at least two color forming layers where at least one color forming layer contains a radiation absorber.

As used herein, the term "color forming layer" typically includes a color former, a developer, a polymer matrix, and an optional radiation absorber. These components can work together upon exposure to radiation to develop the color former to produce a dye having color or a change in color. For purposes of the present invention, the term "color" or "colored" can refer to change in visible absorbance that occurs upon development, including development to black, white, or traditional colors. An undeveloped color former can be colorless or may have some color which changes upon development to a different color. It is to be understood that when the color forming layer does not contain a radiation absorber, the color forming layer is in thermal contact with a radiation absorber from an adjacent color forming layer, such that upon exposure to electromagnetic radiation, the color forming layer can develop a color former.

As used herein, the term "color former" refers to any composition or composite which changes color upon application of energy. Color formers can typically include leuco dyes, photochromic dyes, or the like.

As used herein, "developing," "development," or the like refers to an interaction or reaction which affects a color former, e.g., a leuco dye, to produce a visible change in color through reduction to the corresponding colored color former. In one embodiment, the color former can be reduced to form a color or black.

As used herein, "radiation absorber" refers generally to a radiation sensitive agent that can generate heat or otherwise transfer energy to surrounding molecules upon exposure to radiation at a specific wavelength. When admixed with or in thermal contact with a color former, such as a leuco dye or photochromic dye, and/or a corresponding developer, a radiation absorber can be present in sufficient quantity so as to produce energy sufficient to at least partially develop the color former.

As used herein, "thermal contact" refers to the spatial relationship between an absorber and a color forming composite. For example, when an absorber is heated by interaction with laser radiation, the energy generated by the absorber should be sufficient to cause the color former of the color forming composite to darken, change, or become colored, through a chemical reaction. Thermal contact can include close proximity between an absorber and a color forming composite, which allows for energy transfer from the absorber toward the color former and/or developer. Thermal contact can also include actual contact between an absorber and color former, such as in immediately adjacent layers, or in an admixture including both constituents.

As used herein, the term "spin-coatable composite" when referring to a composition includes a liquid carrier having various components dissolved or dispersed therein. In some embodiments, the spin-coatable composite can comprise a color former, e.g., leuco dye or photochromic dye, uncured polymer matrix material, a developer, and a radiation absorber in a common liquid carrier. In other embodiments the common liquid carrier can be the uncured polymer matrix material or uncured monomers. In still other embodiments, fewer components can be present in a liquid carrier forming the spin-coatable composite. Color forming composites can be spin-coatable in one embodiment, or can be configured for other application methods as well, e.g., printing such as offset, ink-jet, gravure, roller coating, screen printing, spraying, or other application methods known to those skilled in the art.

As used herein, "optimization" and "optimized" refer to a process of selection of components of the color forming composite or layer which results in a rapidly developable composition under a fixed period of exposure to radiation at a specified power. However, "optimized" does not necessarily indicate that the color forming composite is developed most rapidly at a specific wavelength, but rather that the composite can be developed within a specified time frame using a given radiation source. An optimized composite would also indicate an ambient light stability over extended periods of time, i.e. several months to years. Thus, an optimized composite results from a combination of all components of the color forming composite in affecting development characteristics and stability.

As used herein, "CIELAB color space" refers to a color space system where a color is defined using three terms L*, a*, and b*. With this system, L* defines the lightness of a color, and it ranges from 0 to 100 (with 100 being white). Additionally, the terms a* and b*, together, define the hue, where a* ranges from a negative number (green) to a positive number (red), and b* ranges from a negative number (blue) to a positive number (yellow). The CIELAB color system is well known in the art.

As used herein, "optical disk" is meant to encompass audio, video, multi-media, and/or software disks that are machine readable in a CD and/or DVD drive, or the like. Examples of optical disk formats include writeable, recordable, and rewriteable disks such as DVD, DVD-R, DVD-RW, DVD+R, DVD+RW, DVD-RAM, CD, CD-ROM, CD-R, CD-RW, HD DVD, BLU-RAY, and the like. Other like formats may also be included, such as similar formats and formats to be developed in the future.

As used herein, "graphic display" or "color image" can include any visible character or image found on an optical disk or other substrate. With an optical disk, the graphic display is found prominently on one side, though this is not always the case.

As used herein, "data" is typically used with respect to the present disclosure to include the non-graphic information contained on the optical disk that is digitally or otherwise embedded therein. Data can include audio information, video information, photographic information, software information, and the like.

It is notable that, with respect to color formers, radiation absorbers, stabilizers, anti-fade agents, activators, reducing agents, and other non-liquid carrier components, the weight percent values are measured relative to a dry basis, thus excluding the liquid carrier. In other words, unless otherwise specified, values of "wt %" refer to the compositions that will be present in the color forming composite excluding any volatile carrier, such as after drying or curing, as in case of UV (ultraviolet) or EB (electron beam) curable formulations, on a substrate. If the liquid carrier is the uncured polymer matrix material or uncured monomers that remain in the composition, such carriers would be included in the "wt %" calculations.

As used herein, the term "about" is used to provide flexibility to a numerical range endpoint by providing that a given value may be "a little above" or "a little below" the endpoint. The degree of flexibility of this term can be dictated by the particular variable and would be within the knowledge of those skilled in the art to determine based on experience and the associated description herein.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 wt % to about 5 wt %" should be interpreted to include not only the explicitly recited values of about 1 wt % to about 5 wt %, but also include individual values and sub-ranges within the indicated range. Thus, included in this numerical range are individual values such as 2, 3.5, and 4 and sub-ranges such as from 1-3, from 2-4, and from 3-5, etc. This same principle applies to ranges reciting only one numerical value. Furthermore, such an interpretation should apply regardless of the breadth of the range or the characteristics being described.

It has been recognized that it would be advantageous to develop color forming composites suitable for development over a wide variety of applications. In accordance with this, the present invention is drawn to composites, methods, and systems having a color forming composite with at least two color forming layers. It is noted that when discussing a color forming composite, a method of forming color images, or a system having a color forming composite, each of these discussions can be considered applicable to each of these embodiments, whether or not they are explicitly discussed in the context of that embodiment. Thus, for example, in discussing the radiation absorbers present in a color forming composite, those radiation absorbers can also be used in a system for labeling with a color forming composite or a method or forming color images, and vice versa.

In accordance with the present invention, a color forming composite can include a first color forming layer having a first polymer matrix, a first color former, and a first developer where the first color former and the first developer can be in separate phases within the first color forming layer; a second color forming layer having a second polymer matrix, a second color former, and a second developer where the second color former and the second developer can be in separate phases within the second color forming layer; and at least one radiation absorber. The radiation absorber can be present in at least one of the first or second color forming layers. Additionally, the first color forming layer can have a first extinction coefficient that is higher than a second extinction coefficient of the second color forming layer.

In another embodiment, a system for labeling a substrate can include an image data source; a substrate having a color forming composite, as previously described, coated thereon; and an electromagnetic radiation source operatively connected to the image data source and configured to direct electromagnetic radiation to the color forming composite at a wavelength and power level for a sufficient amount of time to cause the radiation absorber to generate enough heat to develop at least one color former.

In still another embodiment, a method of forming multi-colored images on a substrate can include providing a color forming layered composite, as previously described, on the substrate. An additional step includes directing electromagnetic radiation from an electromagnetic radiation source onto a first portion of the color forming layered composite at a first wavelength and first power level for a sufficient amount of time to cause the radiation absorber to generate enough heat to at least partially develop at least one color former, thereby generating a colored image. Further, another step can include directing additional electromagnetic radiation from an electromagnetic radiation source onto a second portion of the color forming composite at a second wavelength or second power level for a sufficient amount of time to cause the radiation absorber to generate enough heat to develop the color forming layered composite in a manner that has a perceptibly different color than the colored image, thereby forming the multi-colored image.

Specific color formers, radiation absorbers, and other components of the color forming composite can each affect the development properties and long-term stability of the color forming composite and are discussed in more detail below.

Color Forming Layer

Color forming layers of the present invention can include a color former, a polymer matrix, a developer, and an optional radiation absorber. The color forming layers generally can have two phases, a color former phase containing the color former and a developer phase containing the developer. Such a composition can physically separate the color former from the developer. Either phase can contain the polymer matrix and optional radiation absorber. In one aspect, the color former phase can include the polymer matrix. Alternately, the developer phase can include the polymer matrix. Generally, one component, i.e., either the developer or the color former, can be solubilized in the polymer matrix and the other component can be dispersed within the polymer matrix. This type of composition can be formed by any known method such as mixing, rolling, or the like such that one component can be dissolved and the other component can be dispersed within the composition. In one aspect, it can be desirable to uniformly disperse the color former phase as the insoluble phase throughout the developer phase which contains the polymer matrix. Uniformly dispersing the color former phase within the developer phase allows for increased contact of the color former with the developer and/or other energy transfer materials, which are discussed below in more detail. Further, a dispersion of color former phase within the developer phase can be formed as a single homogenous composition, e.g., a paste, which can then be coated on a substrate in a single step. The volume of color former phase dispersed within the developer phase can vary considerably depending on the concentration and type of color former used, as well as a number of other factors such as desired development speed, desired color intensity of developed color former, and the like. However, as a general guideline, the color former in the polymer matrix can be from about 1 wt % to about 50 wt %, and in some cases from about 10 wt % to about 40 wt %. Alternatively, the color former phase and developer phase can be formed in adjacent separate layers.

A wide variety of color formers can be included within the color former phase. Almost any known color forming dye can be used, as long as the color development criteria discussed herein are met. Suitable leuco dyes include, but are not limited to, fluorans, phthalides, amino-triarylmethanes, aminoxanthenes, aminothioxanthenes, amino-9,10-dihydroacridines, aminophenoxazines, aminophenothiazines, aminodihydro-phenazines, aminodiphenylmethanes, aminohydrocinnamic acids (cyanoethanes, leuco methines) and corresponding esters, 2(phydroxyphenyl)-4,5-diphenylimidazoles, indanones, leuco indamines, hydrozines, leuco indigoid dyes, amino-2,3-dihydroanthraquinones, tetrahalo-p,p'-biphenols, 2(phydroxyphenyl)-4,5-diphenylimidazoles, phenethylanilines, phthalocyanine precursors (such as those available from Sitaram Chemicals, India), and mixtures thereof. In one aspect of the present invention, the leuco dye can be a fluoran, phthalide, aminotriarylmethane, or mixture thereof.

Additionally, fluoran based leuco dyes have proven exceptionally useful for incorporation into the color forming composites of the present invention. Several non-limiting examples of suitable fluoran based leuco dyes include 3-diethylamino-6-methyl-7-anilinofluorane, 3-(N-ethyl-ptoluidino)-6-methyl-7-anilinofluorane, 3-(N-ethyl-N-isoamylamino)-6-methyl-7-anilinofluorane, 3-diethylamino-6-methyl-7-(o,p-dimethylanilino)fluorane, 3-pyrrolidino-6-methyl-7-anilinofluorane, 3-piperidino-6-methyl-7-anilinofluorane, 3-(N-cyclohexyl-N-methylamino)-6-methyl-7-anilinofluorane, 3-diethylamino-7-(m-trifluoromethylanilino) fluorane, 3-dibutylamino-6-methyl-7-anilinofluorane, 3-diethylamino-6-chloro-7-anilinofluorane, 3-dibutylamino-7-(o-chloroanilino) fluorane, 3-diethylamino-7-(ochloroanilino) fluorane, 3-di-n-pentylamino-6-methyl-7-anilinofluoran, 3-di-n-butylamino-6-methyl-7-anilinofluoran, 3-(n-ethyl-n-isopentylamino)-6-methyl-7-anilinofluoran, 3-pyrrolidino-6-methyl-7-anilinofluoran, 1 (3H)-isobenzofuranone,4,5,6,7-tetrachloro-3,3-bis[2-[4-(dimethylamino)phenyl]-2-(4-methoxyphenyl)ethenyl], 2-anilino-3-methyl-6-(N-ethyl-N-isoamylamino)fluorane (S-205 available from Nagase Co., Ltd), and mixtures thereof. Aminotriarylmethane leuco dyes can also be used in the present invention such as tris(N,N-dimethylaminophenyl) methane (LCV); deutero-tris(N,N-dimethylaminophenyl)methane (D-LCV); tris(N,N-diethylaminophenyl)methane (LECV); deutero-tris(4-diethylaminolphenyl)methane (D-LECV); tris(N,N-di-n-propylaminophenyl) methane (LPCV); tris(N,N-din-butylaminophenyl)methane (LBCV); bis(4-diethylaminophenyl)-(4-diethylamino-2-methyl-phenyl) methane (LV-1); bis(4-diethylamino-2-methylphenyl)-(4-diethylamino-phenyl)methane (LV-2); tris(4-diethylamino-2-methylphenyl)methane (LV-3); bis(4-diethylamino-2-methylphenyl)(3,4-dimethoxyphenyl)methane (LB-8); aminotriarylmethane leuco dyes having different alkyl substituents bonded to the amino moieties wherein each alkyl group is independently selected from $C_1$-$C_4$ alkyl; and aminotriaryl methane leuco dyes with any of the preceding named structures that are further substituted with one or more alkyl groups on the aryl rings wherein the latter alkyl groups are independently selected from $C_1$-$C_3$ alkyl.

Other color formers can also be used in connection with the present invention and are known to those skilled in the art. A more detailed discussion of some of these types of leuco dyes can be found in U.S. Pat. Nos. 3,658,543 and 6,251,571, each of which are hereby incorporated by reference in their entireties.

Typically, the leuco dye can be present in the color forming layers of the color forming composites of the present invention at from about 1 wt % to about 50 wt %. Although amounts outside this range can be successfully used, depending on the other components of the composite, amounts from about 5 wt % to about 40 wt % or about 10 wt % to about 35 wt % frequently provide adequate results.

The composites of the present invention include a developer. Typical developers include 1-phenyl-3-pyrozolidone (phenidone), hydrazine, formamide, formic acid, hexaarylbiimidazoles (HABI), ascorbic acid, phenols, and substituted phenols (e.g., sulfonyl phenols), and mixtures thereof. In one embodiment, the developer can be phenols, substituted phenols, or mixtures thereof.

Non-limiting examples of suitable developers for use in the present invention include bis-phenol A, p-hydroxy benzyl benzoate, TG-SA (Phenol, 4,4-α-sulfonylbis[2-(2-propenyl)), and poly-phenols. Examples of additional acidic materials that can be use as developers include any lewis acid, without limitation, phenols, carboxylic acids, cyclic sulfonamides, protonic acids, zinc chloride, magnesium carboxylates, zinc carboxylates, calcium carboxylates, transition metal salts and other compounds having a pKa of less than about 7.0, and mixtures thereof. Specific phenolic and carboxylic secondary developers can include, without limitation, boric acid, oxalic acid, maleic acid, tartaric acid, citric acid, succinic acid, benzoic acid, stearic acid, gallic acid, salicylic acid, 1-hydroxy-2-naphthoic acid, o-hydroxybenzoic acid, m-hydroxybenzoic acid, 2-hydroxy-p-toluic acid, 3,5-xylenol, thymol, p-t-butylphenyl, 4-hydroxyphenoxide, methyl-4-hydroxybenzoate, 4-hydroxyacetophenone, α-naphthol, naphthols, catechol, resorcin, hydroquinone, 4-t-octylcatechol, 4,4'-butylidenephenol, 2,2'-dihydroxydiphenyl, 2,2'-methylenebis(4-methyl-6-t-butyl-phenol), 2,2'-bis (4'-hydroxyphenyl)propane, 4,4'-isopropylidenebis(2-t-butylphenol), 4,4'-secbutylidenediphenol, pyrogallol, phloroglucine, phlorogluocinocarboxylic acid, 4-phenylphenol, 2,2'-methylenebis(4-chlorophenyl), 4,4'-isopropylidene-diphenol, 4,4'-isopropylidenebis(2-chlorophenol), 4,4'-isopropylidenebis(2-methylphenol), 4,4'-ethylenebis(2-methylphenol), 4,4'-thiobis(6-t-butyl-3-methylphenol), bisphenol A and its derivatives (such as 4,4'-isopropylidene-diphenol, 4-4'-cyclohexylidenediphenol, p,p'-(1-methyl-n-hexylidene) diphenol, 1,7-di (4-hydroxyphenylthio)-3,5-dioxaheptane), 4-hydroxybenzoic esters, 4-hydroxyphthalic diesters, phthalic monoesters, bis(hydroxyphenyl)sulfides, 4-hydroxyarylsulfones, 4-hydroxyphenylarylsulfonates, 1,3-di[2-(hydroxyphenyl)-2-propyl]benzenes, 1,3-dihydroxy-6 (α,α-dimethylbenzyl)benzene, resorcinols, hydroxybenzoyloxybenzoic esters, bisphenolsulfones, bis-(3-allyl-4-hydroxyphenyl)sulfone (TG-SA), bisphenolsulfonic acids, 2,4-dihydroxy-benzophenones, novolac type phenolic resins, polyphenols, saccharin, 4-hydroxy-acetophenone, p-phenylphenol, benzyl-p-hydroxybenzoate (benzalparaben), 2,2-bis(p-hydroxyphenyl)propane, p-tert-butylphenol, 2,4-dihydroxy-benzophenone, and p-benzylphenol. In some embodiments, the developer can be an acidic phenolic compound.

Specifically, the first and second developers can be include, without limitation, 4,4'-dihydroxydiphenylsulfone, 4-hydroxy-4'-isopropoxydiphenyl sulfone, 4,4' thiobis(6-tert-butyl-3-methylphenol), and mixtures thereof.

In order to reduce development times and increase sensitivity to an applied radiation source, the color former phase can further include a melting aid. Suitable melting aids can have a melting temperature from about 50° C. to about 150° C. and often from about 70° C. to about 120° C. Melting aids are typically crystalline organic solids which can be melted and mixed with a particular color former. For example, most color formers are also available as a solid particulate which is soluble in standard liquid solvents. Thus, the color former and melting aid can be mixed and heated to form a molten mixture. Upon cooling, a color former phase of color former and melting aid is formed which can then be ground into a powder. In some embodiments of the present invention, the percent of color former and melting aid can be adjusted to minimize the melting temperature of the color former phase without interfering with the development properties of the color former. When used, the melting aid can comprise from about 5 wt % to about 25 wt % of the color former phase.

A number of melting aids can be effectively used in the color forming composites of the present invention. Several non-limiting examples of suitable melting aids include m-terphenyl, p-benzyl biphenyl, alpha-napthyl benzylether, 1,2-bis(3,4)dimethylphenyl ethane, and mixtures thereof. Suitable melting aids can also include aromatic hydrocarbons (or their derivatives) which provide good solvent characteristics with the color former and radiation absorbers used in the formulations and methods of the present invention. In addition to dissolving the color former and radiation absorber, the melting aid can also assist in reducing the melting temperature of the color former and stabilize the color former phase in the amorphous state (or at least slow down recrystallization of the color former phase into individual components). In general, any material having a high solubility and/or miscibility with the color former to form a glass or co-crystalline phase with the dye, and alters the melting property of the dye is useful in this process. For example, aromatic hydrocarbons, phenolic ethers, aromatic acid-esters, long chain ($C_6$ or greater) fatty acid esters, polyethylene wax, or the like can also be suitable melting aids.

Additional materials can also be included in the color former phase such as, but not limited to, stabilizers, anti-oxidants, non-leuco colorants, radiation absorbers, and the like.

Radiation Absorber

A radiation absorber can be included in the color forming composite as a component which can be used to develop the color forming composite upon exposure to radiation at a predetermined exposure time and/or wavelength. The radiation absorber can act as an energy antenna, providing energy to surrounding areas upon interaction with an energy source. As a predetermined amount of energy can be provided by the radiation absorber, matching of the radiation wavelength and intensity to the particular absorber used can be carried out to optimize the system. As such, in one aspect, the radiation absorber can be selected in order to optimize radiation sensitivity of the color forming composite.

Various radiation absorbers can act as an antenna to absorb electromagnetic radiation of specific wavelengths and ranges. The composites of the present invention using appropriate radiation absorbers can be suited for use with components that are already available on the market or are readily modified to accomplish imaging. In one embodiment, wavelengths from about 200 nm to about 1000 nm can be used in accordance with the present invention.

The radiation absorber can be configured to be in a heat-conductive relationship with the color formers of the present invention. The radiation absorber can be present in a color forming layered composite in at least one color forming layer. For example, the radiation absorber can be included within the color forming layer in either the color former phase or the developer phase, or both phases. Additionally, the radiation absorber can be present in either the first or second color forming layer, or both layers. In one embodiment, the radiation absorber can be present in only one color forming layer. Thus, the radiation absorber can be admixed with or in thermal contact with the color former. In one aspect, the radiation absorber can be present in both the color former phase and the polymer matrix. In this way, substantially the entire color forming composite in an exposed area can be heated quickly and substantially simultaneously. This is also beneficial when a developer is included in the polymer matrix. When only one radiation absorber is present in the color forming composite, the radiation absorber can be present in a higher quantity in one of the color forming layers.

In one embodiment, the color forming composites can have a first radiation absorber in the first color forming layer and a second radiation absorber in the second color forming layer. Generally, when two radiation absorbers are present, the extinction coefficients of the radiation absorbers can be different. In one aspect, the composites of the present invention can have a first color forming layer having a first extinction coefficient and a second color forming layer having a second extinction coefficient where the first extinction coefficient is 1.5 times higher than the second extinction coefficient. In another aspect, the first extinction coefficient can be 2 times higher than the second extinction coefficient. Additionally, the composite can have a first color forming layer that can produce a lighter color, i.e. higher in the lightness coordinate, L*, in CIELAB color space, than the second color forming layer.

Consideration can also be given to choosing the radiation absorber such that any light absorbed in the visible range does not adversely affect the graphic display or appearance of the color forming composite either before or after development.

A radiation absorber suitable for the present invention can have a maximum light absorption at or in the vicinity of the desired radiation wavelength, e.g., 200 nm to 1000 nm. Typical examples of suitable radiation absorbers can include, but are not limited to, aluminum quinoline complexes, porphyrins, porphins, indocyanine dyes, phenoxazine derivatives, phthalocyanine dyes, polymethyl indolium dyes, polymethine dyes, guaiazulenyl dyes, croconium dyes, polymethine indolium dyes, metal complex IR dyes, cyanine dyes, squarylium dyes, chalcogeno-pyryloarylidene dyes, indolizine dyes, pyrylium dyes, quinoid dyes, quinone dyes, azo dyes, and mixtures or derivatives thereof.

Non-limiting specific examples of suitable quinoline complexes can include tris(8-hydroxyquinolinato)aluminum (CAS 2085-33-8) and derivatives such as tris(5-cholor-8-hydroxyquinolinato)aluminum (CAS 4154-66-1), 2-(4-(1-methyl-ethyl)-phenyl)-6-phenyl-4H-thiopyran-4-ylidene)-propanedinitril-1,1-dioxide (CAS 174493-15-3), 4,4'-[1,4-phenylenebis(1,3,4-oxadiazole-5,2-diyl)]bis N,N-diphenyl benzeneamine (CAS 184101-38-0), bis-tetraethylammonium-bis(1,2-dicyano-dithiolto)-zinc(II) (CAS 21312-70-9), 2-(4,5-dihydronaphtho[1,2-d]-1,3-dithiol-2-ylidene)-4,5-dihydro-naphtho[1,2-d]1,3-dithiole, all available from Syntec GmbH. Non-limiting examples of specific porphyrin and porphyrin derivatives can include etioporphyrin 1 (CAS 448-71-5), deuteroporphyrin IX 2,4 bis ethylene glycol (D630-9) available from Frontier Scientific, and octaethyl porphrin (CAS 2683-82-1), azo dyes such as Mordant Orange CAS 2243-76-7, Merthyl Yellow (60-11-7), 4-phenylazoaniline (CAS 60-09-3), Alcian Yellow (CAS 61968-76-1), available from Aldrich chemical company, and mixtures thereof.

In one embodiment, it may be advantageous to use near infrared dyes (NIR) dyes as radiation absorbers for the described compositions. NIR dyes generally have lower visible signature and so interfere less with color of the developed coating. There is a number of cyanine dyes with extinction in vicinity of 780 nm which are commercially available on the market. The first radiation-absorbing compound can be selected from a number of radiation absorbers (in most of the cases cyanine dyes) such as, but not limited to, a) IR-780 iodide, (Aldrich 42,531-1) (1) (3H-Indolium, 2-[2-[2-chloro-3-[(1,3-dihydro-3,3-dimethyl-1-propyl-2H-indol-2-ylidene)ethylidene]-1-cyclohexen-1-yl]ethenyl]-3,3-dimethyl-1-propyl-, iodide(9Cl));

b) IR783 (Aldrich 54,329-2) (2) (2-[2-[2-Chloro-3-[2-[1,3-dihydro-3,3-dimethyl-1-(4-sulfobutyl)-2H-indol-2-ylidene]-ethylidene]-1-cyclohexen-1-yl]-ethenyl]-3,3-dimethyl-1-(4-sulfobutyl)-3H-indoliumhydroxide, inner salt sodium salt);

c) 3H-Indolium, 2-[2-[2-chloro-3-[(1,3-dihydro-1,3,3-trimethyl-2H-indol-2-ylidene)ethylidene]-1-cyclopenten-1-yl]ethenyl]-1,3,3-trimethyl-, salt with 4-methylbenzenesulfonic acid (1:1) (9Cl)-(Lambda max −797 nm), CAS No. 193687-61-5, available from "Few Chemicals GMBH" as S0337;

d) 3H-Indolium, 2-[2-[3-[(1,3-dihydro-1,3,3-trimethyl-2H-indol-2-ylidene)ethylidene]-2-[(1-phenyl-1H-tetrazol-5-yl)thio]-1-cyclohexen-1-yl]ethenyl]-1,3,3-trimethyl-, chloride (9Cl), (Lambda max −798 nm), CAS No. 440102-72-7, available from "Few Chemicals GMBH" as S0507;

e) 1H-Benz[e]indolium, 2-[2-[2-chloro-3-[(1,3-dihydro-1,1,3-trimethyl-2H-benz[e]indol-2-ylidene)ethylidene]-1-cyclohexen-1-yl]ethenyl]-1,1,3-trimethyl-, chloride (9Cl) (Lambda max −813 nm), CAS No. 297173-98-9, available from "Few Chemicals GMBH" as S0391;

f) 1H-Benz[e]indolium, 2-[2-[2-chloro-3-[(1,3-dihydro-1,1,3-trimethyl-2H-benz[e]indol-2-ylidene) ethylidene]-1-cyclohexen-1-yl]ethenyl]-1,1,3-trimethyl-, salt with 4-methylbenzenesulfonic acid (1:1) (9Cl) (Lambda max −813 nm), CAS No. 134127-48-3, available from "Few Chemicals GMBH" as S0094, also known as Trump Dye or Trump IR; and g) 1H-Benz[e]indolium, 2-[2-[2-chloro-3-[(3-ethyl-1,3-dihydro-1,1-dimethyl-2H-benz[e]indol-2-ylidene)ethylidene]-1-cyclohexen-1-yl]ethenyl]-3-ethyl-1,1-dimethyl-, salt with 4-methylbenzenesulfonic acid (1:1) (9Cl) (Lambda max −816 nm), CAS No. 460337-33-1, available from "Few Chemicals GMBH" as S0809.

In formulating an optimized color forming composite of the present invention, such a composite can depend on a variety of factors, since each component can affect the development properties, e.g., time, color intensity, etc. For example, a color forming composite having a radiation absorber with a maximum absorption of about 430 nm may not develop most rapidly at 430 nm. Other components and the specific formulation can result in an optimized composite at a wavelength which does not correspond to the maximum absorption of the radiation absorber. Thus, the process of formulating an optimized color forming composite may include testing formulations to achieve a desired development time using a specific intensity and wavelength of energy to form an acceptable color change.

Radiation absorbers suitable for the present invention may have a pre-existing coloration. Therefore, color forming composites containing such radiation absorbers can have a slight coloration. In order to achieve a visible contrast between developed areas and non-imaged or non-developed areas of the coating, the color former can be chosen to form a color that is different than that of the background. For example, color formers having a developed color such as black, blue, red, magenta, and the like can provide a good contrast to a more yellow or green background. Optionally, an additional non-color former colorant can be added to the color forming composites of the present invention or the substrate on which the color forming composite is placed. Any known non-color former colorant, e.g., standard dyes and/or pigments, can be used to achieve almost any desired background color for a given commercial product. Although the specific color formers, developers, polymers, and absorbers discussed herein are typically separate compounds, compounds having a combination of absorbing characteristics, binding characteristics, developing characteristics, and color forming characteristics are considered within the scope of the present invention.

Generally, the radiation absorber can be present in the color forming layers in the color forming composite in an amount of from about 0.001 wt % to about 10 wt %, and typically, from about 0.5 wt % to about 2 wt %, although other weight ranges may be desirable depending on the activity of the particular absorber.

Polymer Matrix

The color forming composites of the present invention can typically include a polymer matrix which acts primarily as a binder. As mentioned above, the color former phase can be dispersed within or otherwise carried by the polymer matrix. Various polymer matrix materials can influence the development properties of the color forming composite such as development speed, light stability, and wavelengths which can be used to develop the composite. Acceptable polymer matrix materials can also include, by way of example, UV curable pre-polymers or monomers such as acrylate derivatives, oligomers, and monomers, including, without limitation, isobornyl methacrylate, isobornyl acrylate, dicyclopentadienyl acrylate, dicyclopentadienyl methacrylate, cyclohexyl (meth)acrylate, cyclohexyl acrylate, cyclohexyl (meth)acrylate, dicyclopentanyl (meth)acrylate, tert-butyl acrylate, tert-butyl methacrylate, dicyclopentanyloxyethyl (meth)acrylate, dicyclopentenyloxyethyl (meth)acrylate, 4-tert-butylstyrene, 1,6-hexanediol diacrylate, tripropylene glycol diacrylate, ethoxylated bis-phenol-A diacrylates, and derivatives and mixtures thereof.

Such UV curable acrylate derivatives, oligomers, and monomers may be part of a photo package. A photo package can include a light absorbing species which initiates reactions for curing of a lacquer. Such light absorbing species can be sensitized for curing using UV or electron beam curing systems, such as, by way of example, benzophenone derivatives. Other examples of photoinitiators for free radical polymerization monomers and pre-polymers can include, but are not limited to, thioxanethone derivatives, anthraquinone derivatives, acetophenones, benzoine ethers, and mixtures thereof.

In particular embodiments of the invention, it can be desirable to choose a polymer matrix which is cured by a form of radiation that does not also develop the color former or otherwise decrease the stability of the color forming composite at the energy input and flux necessary to cure the coatings. Thus, the polymer matrix can be curable at a curing wavelength which is substantially different than the development wavelength.

Further, a suitable photoinitiator should also have light absorption band which is not obscured by the absorption band of the radiation absorber, otherwise the radiation absorber can interfere with photoinitiator activation and thus prevent cure of the coating. Therefore, in one practical embodiment, a photoinitiator light absorption band can lie within the UV region, e.g., from about 200 to about 380 nm, and the absorber band lies from about 680 to about 820 nm. However, in practice these band overlap. A working system design is possible because the energy flux required for development of a color former is about ten times higher than needed for initiation of the cure. In yet another embodiment, the absorber has a dual function, curing the UV curable polymer (relatively low energy flux), and developing the color former. This is possible because the energy flux during cure is typically an order of magnitude lower than needed for developing the color former.

Polymer matrix materials based on cationic polymerization resins can include photo-initiators based on aromatic diazonium salts, aromatic halonium salts, aromatic sulfonium salts, and metallocene compounds. Additional examples of curing agents are α-aminoketones, α-hydroxyketones, phosphineoxides available from Ciba-Geigy under the name of Irgacure and Darocure agents, and sensitizers such as 2-isopropyl-thioxanthone. One specific example of a suitable polymer matrix is Nor-Cote CDG-1000 (a mixture of UV curable acrylate monomers and oligomers) which contains a photoinitiator (hydroxy ketone) and organic solvent acrylates (e.g., methyl methacrylate, hexyl methacrylate, beta-phenoxy ethyl acrylate, and hexamethylene acrylate), available form Nor-Cote. Other suitable components for polymer matrix materials can include, but are not limited to, acrylated polyester oligomers, such as CN293 and CN294 as well as CN-292 (low viscosity polyester acrylate oligomer), SR-351 (trimethylolpropane triacrylate), SR-395(isodecyl acrylate) and SR-256(2(2-ethoxyethoxy)ethyl acrylate), all of which are available from Sartomer Co.

Additionally, binders can be included as part of the polymer matrix. Suitable binders can include, but are not limited to, polymeric materials such as polyacrylate from monomers and oligomers, polyvinyl alcohols, polyvinyl pyrrolidines, polyethylenes, polyphenols or polyphenolic esters, polyurethanes, acrylic polymers, and mixtures thereof. For example, the following binders can be used in the color forming composite of the present invention: cellulose acetate butyrate, ethyl acetate butyrate, polymethyl methacrylate, polyvinyl butyral, and mixtures thereof.

Other Optional Ingredients

The color forming composites of the present invention can also include various additional components such as colorants, liquid vehicles, stabilizers, anti-fade agents, plasticizers, and other additives known to those skilled in the art.

In certain embodiments of the present invention, it is sometimes desirable to add a plasticizer to improve coating flexibility, durability, and coating performance. Plasticizers can be either solid or liquid plasticizers. Such suitable plasticizers are well known to those skilled in the art, as exemplified in U.S. Pat. No. 3,658,543, which is incorporated herein by reference in its entirety. Specific examples of plasticizers include, but are not limited to, cellulose esters such as an o-phenyl phenol ethylene oxide adduct (commercially available as MERPOL 2660 from E.I. Du Pont de Nemours & Co., Wilmington, Del.), polyethylene glycols and substituted phenolethylene oxide adducts such as nonylphenoxypoly(ethyleneoxy)-ethanol (commercially available as IGEPAL CO 210 from Aldrich Chemical Co.), acetates, butyrates, cellulose acetate butyrates, and mixtures thereof. The plasticizer can be included in either or both of the polymer matrix and the color former phase.

Other additives can also be utilized for producing particular commercial products such as including a colorant to impart additional desired color to the image. The colorants can be color formers which are developed at various wavelengths or non-leuco colorants which can provide a background color. In one embodiment, optional colorants can be standard pigments and/or dyes. For example, the use of an opacifier pigment or other colorant can provide background color to the substrate. The optional colorants can be added to the color forming composite, underprinted, or overprinted, as long as the development of the color former is not prevented from at least some development due to the presence of the optional colorant.

In one embodiment, the color forming composite can be prepared in a solution which is substantially transparent or translucent. Any suitable liquid carrier, e.g., an alcohol with a surfactant, can be used which is compatible with a particular color former, polymer matrix, and/or other components chosen for use. The liquid carrier can include, but is not limited to, solvents such as methylethyl ketone, isopropyl alcohol or other alcohols and diols, water, surfactants, and mixtures thereof. When the color forming composite is prepared in a solution form, it may be desirable to underprint a colored coating over at least a portion of the substrate beneath the color forming composite. The optional colored coating produces a background color that can be visible underneath the solution layer. This colored coating can contain various colorants such as other pigments and/or dyes.

The color forming composite can be prepared in a number of ways for application to a substrate. Often, the liquid carrier can be used which can be at least partially removed through known solvent removal processes. Typically, at least a portion of the liquid carrier can be driven off or allowed to evaporate after the coating process is complete. Further, various additional components, such as lubricants, surfactants, and materials imparting moisture resistance, can also be added to provide mechanical protection to the color forming composite. Other overcoat compositions can also be used and are well known to those skilled in the art.

In one aspect of the present invention, the color forming layers of the color forming composite can be spin-coatable. In order to provide desirable color forming properties and spin-coatability, various factors such as viscosity and solids content can also be considered. The color forming layers of the color forming composites of the present invention can have less than about 10 wt % of solids, which typically provides good coating properties. For example, in one aspect, the solids content of a spin-coatable color forming layer can be from about 5 wt % to about 9 wt %.

Radiation Application for Development

In one embodiment of the present invention, the color forming composite can be applied to a substrate. The color forming layers of the composite can be applied to the substrate using any known technique such as spin-coating, screen printing, sputtering, spray coating, ink-jetting, gravure printing, roller coating, spraying, or the like. A variety of substrates can be used such as an optical disk, polymeric surface, glass, ceramic, metal, or paper. In one embodiment, the color forming composite can be applied to an optical disk and select portions thereof developed using a laser or other radiation source.

Once the color forming composite is applied to the substrate, the conditions under which the color forming composites of the present invention are developed can be varied. For example, one can vary the electromagnetic radiation wavelength, heat flux, and exposure time. The amount of energy which is to be applied depends partially on the activation energy of the development reaction of the color former and the specific radiation absorber chosen. However, the energy applied is typically sufficient to develop the color former without also decomposing the color forming composite or damaging the substrate. Such an energy level is typically well below the energy required for decomposition of the color forming composite. Variables such as spot size, focus, and laser power will also affect any particular system design and can be chosen based on the desired results. With these variables fixed at predetermined values, the radiation source can then direct electromagnetic radiation to the color forming composite in accordance with data received from a signal processor. Further, color former and/or radiation absorber concentration and proximity to one another can also be varied to affect the development times and the optical density of the developed image.

Additionally, the amount of electromagnetic energy can be varied to develop varying ratios of color formers. In one aspect, electromagnetic radiation can be applied sufficient to develop only one color former. Additional electromagnetic radiation can be applied to form both color formers. In one aspect, the composites described herein can be exposed to electromagnetic energy sufficient to provide an array of colors by partially developing the first color former or developing the first color former and partially developing the second color former.

Typically, an image to be formed on the surface can be digitally stored and then rasterized or spiralized. The resulting data can be delivered to a radiation source which exposes portions of the color forming composite to radiation while the optical disk is spinning. Any number of electromagnetic radiation sources can be used. Lasers provide a simple and effective way of delivering focused and highly controlled pulsed light at a desired wavelength such as from about 200 nm to about 1000 nm. In one embodiment, the electromagnetic radiation source can be a single wavelength laser.

The color forming composites of the present invention can be developed using lasers having from about 15 to 100 mW power usage, although lasers having a power outside this range can also be used. Typically, lasers having from about 30 mW to about 50 mW are readily commercially available and work well using the color forming composite described herein. The spot size generated by the laser can be determined by radiation that contacts the substrate at a single point in time. The spot size can be circular, oblong, or other geometric shape, and can range from about 1 μm to about 200 μm along a largest dimension and often from about 10 μm to about 60 μm, though smaller or larger sizes can also be used. In a further aspect, spot sizes of 20 μm by 50 μm, as measured across perpendicular major and minor axes, can provide a good balance between resolution and developing speed.

Heat flux is a variable that can be altered as well, and can be from about 0.05 to 5.0 J/cm$^2$ in one embodiment, and from about 0.3 to 0.5 J/cm$^2$ in a second embodiment. In general, a heat flux of less than 0.5 J/cm$^2$ can also be used. The color forming composites of the present invention can be optimized by adjusting the concentrations and type of radiation absorber, color former, developer, and polymer matrix. Heat flux in these ranges allow for development of color formers in optimized composites in from about 10 μsec to about 100 μsec per dot in some embodiments. Further, the color forming composites of the present invention can be optimized for development in less than about 1 millisecond, and in some embodiments less than about 500 μsec. In some embodiments, the color forming composites of the present invention can be optimized for development in from about 100 μsec to about 500 μsec. Those skilled in the art can adjust these and other variables to achieve a variety of resolutions and developing times. In embodiments where the substrate is an optical disk or other moving substrate, the exposure time will depend on the rate of motion of the substrate. More specifically, in such embodiments, the exposure times above refer the time during which a point on the substrate is exposed to the radiation. For example, a spot size of 50 μm along the direction of rotation will result in a single point on the substrate traveling through the spot starting at one edge and traveling to the opposite edge. The total exposure time is therefore the average time that radiation contacts a particular point on the substrate or color forming composite.

The following example illustrates exemplary embodiments of the invention. However, it is to be understood that the following are only exemplary or illustrative of the application of the principles of the present invention. Numerous modifications and alternative composites, methods, and systems may be devised by those skilled in the art without departing from the spirit and scope of the present invention. The appended claims are intended to cover such modifications and arrangements. Thus, while the present invention has been described above with particularity, the following examples provide further detail in connection with what is presently deemed to be practical embodiments of the invention.

EXAMPLE

Example 1

Preparation of the Prepolymer Mix

A prepolymer mix is prepared in accordance with the compounds list in Table 1:

TABLE 1

| Prepolymer Mix | Wt % |
|---|---|
| 1,6 Hexanediol diacrylate | 28 |
| Isobornyl acrylate | 28 |
| Epoxy-diacrylate oligomer | 28 |
| Methyl methacrylate/Butyl methacrylate (MMA/BMA) resin | 8 |
| Tripropylene glycol diacrylate | 8 |
| Total | 100 |

Specifically, the MMA/BMA resin was dissolved upon heating in a mixture of 1,6 hexanediol diacrylate, isobornyl acrylate, and tripropylene glycol diacrylate monomers. The epoxy-diacrylate oligomer was dissolved in the mix after the MMA/BMA resin dissolution.

Example 2

Preparation of a First Color Forming Layer

A first color forming layer is prepared in accordance with the compounds list in Table 2:

TABLE 2

| First color Forming Layer | Wt % |
|---|---|
| Pre-Polymer Mix from Example 1 | 71.8 |
| Magenta dye (e.g. Noveon Magenta M16) | 9 |
| 1,3-Dioxane | 1.2 |
| 2-Benzyl-2-dimethylamino-1-(4-morpholinophenyl)-butanone-1 and 2,2-Dimethoxy-1,2-diphenylethan-1-one | 6.5 |
| Zn monomethacrylate (Milled <2 um) | 10 |
| Anti-foaming agent | 1.5 |
| Total | 100 |

The magenta dye (color-former), 1,3-dioxane (radiation absorber), 2-benzyl-2-dimethylamino-1-(4-morpholinophenyl)-butanone-1, and 2,2-dimethoxy-1,2-diphenylethan-1-one (photoinitiators) are dissolved in the pre-polymer mix of Example 1 forming a liquid phase. The anti-foaming agent is then added to and dispersed in the solution. Fine milled (preferably <2 um particle size) zinc monomethacrylate (matrix-insoluble developer) is dispersed uniformly in the liquid phase using multiple passes (3-6 times) through 3-roll mill. The resulting mixture has a consistency of paste.

Example 3

Preparation of a Second Color Forming Layer

A second color forming layer is prepared in accordance with the compounds list in Table 3:

TABLE 3

| Second Color Forming Layer | Wt % |
|---|---|
| Pre-Polymer Mix from Example 1 | 52.5 |
| 4-Hydroxy-4'-isopropoxydiphenyl sulfone | 9.2 |
| Naphthalocyanine | 1.3 |
| 4,4'-dihydroxydiphenylsulfone | 4 |
| 2-Benzyl-2-dimethylamino-1-(4-morpholinophenyl)-butanone-1 and 2,2-Dimethoxy-1,2-diphenylethan-1-one | 6.5 |
| Anti-foaming agent | 1.5 |
| 2'-anilino-3'-methyl-6'-(dibutylamino)fluoran (Milled <0.4 um) | 25 |
| Total | 100 |

Developers 4-hydroxy-4'-isopropoxydiphenyl sulfone and 4,4'-dihydroxydiphenylsulfone, and photoinitiators 2-benzyl-2-dimethylamino-1-(4-morpholinophenyl)-butanone-1 and 2,2-dimethoxy-1,2-diphenylethan-1-one are dissolved in the pre-polymer mix from Example 1 forming a liquid phase. An anti-foaming agent is then added to and dispersed in the solution. Fine milled (preferably <0.4 um particle size) matrix-insoluble color-former, 2'-anilino-3'-methyl-6'-(dibutylamino)fluoran, and NIR absorbing pigment naphthalocyanine (available from Yamamoto Chemicals, Inc.) are dispersed uniformly in the liquid phase using multiple passes (3-6 times) through 3-roll mill. The resulting mixture has a consistency of paste.

Example 4

Assembly and Imaging of the Color Forming Composite

The resulting second color forming layer is screen-printed onto a substrate at a thickness of about 5 μm to about 7 μm to form a color forming composite on a substrate. The second color forming layer on the medium was then UV-cured by mercury lamp. Upon curing the polymer matrix, the first color forming layer is screen-printed on top of the second color forming layer at a thickness of about 5 μm to about 7 μm and then UV-cured with mercury lamp. As a result, both color-forming layers are cured, i.e., one on top of the other.

When the resulting color forming composite is imaged with 780 nm laser (spot diameter –20 um; linear spot velocity –250 mm/sec) at output power 15-18 mW, only the top layer of the coating was developed by laser radiation. As a result, the produced image has magenta/pink coloration.

When the resulting color forming composite is imaged with 780 nm laser (spot diameter –20 um; linear spot velocity –250 mm/sec) at a higher power level (output power >38 mW), both layers of the composite are developed. As a result, the produced image has color from dark brown (at power <38-40 mW) to almost black at laser output power significantly higher than 40-50 mW.

It is to be understood that the above-referenced arrangements are illustrative of the application for the principles of the present invention. Numerous modifications and alternative arrangements can be devised without departing from the spirit and scope of the present invention while the present invention has been described above in connection with the exemplary embodiments(s) of the invention. It will be apparent to those of ordinary skill in the art that numerous modifications can be made without departing from the principles and concepts of the invention as set forth in the claims.

What is claimed is:

1. A color forming layered composite, comprising:

a) a first color forming layer comprising a first polymer matrix, a first color former, and a first developer, wherein the first color former and the first developer are in separate phases within the first color forming layer;

b) a second color forming layer comprising a second polymer matrix, a second color former, and a second developer, wherein the second color former and the second developer are in separate phases within the second color forming layer; and c) at least one radiation absorber;

wherein the radiation absorber is present in at least one of the first or second color forming layer, said first color forming layer having a first extinction coefficient that is higher than a second extinction coefficient of said second color forming layer.

2. The composite of claim 1, wherein the radiation absorber is selected from the group consisting of aluminum quinoline complexes, porphyrins, porphins, indocyanine dyes, phenoxazine derivatives, phthalocyanine dyes, polymethyl indolium dyes, polymethine dyes, guaiazulenyl dyes, croconium dyes, polymethine indolium dyes, metal complex IR dyes, cyanine dyes, squarylium dyes, chalcogeno-pyryloarylidene dyes, indolizine dyes, pyrylium dyes, quinoid dyes, quinone dyes, azo dyes, and mixtures or derivatives thereof.

3. The composite of claim 1, wherein at least one of the first or second polymer matrix includes a UV curable polymer.

4. The composite of claim 3, wherein the UV curable polymer is polymerized from monomers selected from the group consisting of isobornyl methacrylate, isobornyl acrylate, dicyclopentadienyl acrylate, dicyclopentadienyl methacrylate, cyclohexyl (meth)acrylate, cyclohexyl acrylate, cyclohexyl (meth)acrylate, dicyclopentanyl (meth)acrylate, tert-butyl acrylate, tert-butyl methacrylate, dicyclopentanyloxyethyl (meth)acrylate, dicyclopentenyloxyethyl (meth) acrylate, 4-tert-butylstyrene, 1,6-hexanediol diacrylate, tripropylene glycol diacrylate, ethoxylated bis-phenol-A diacrylates, and derivatives and mixtures thereof.

5. The composite of claim 1, wherein at least one of the first or second layer further comprises a photoinitiator selected from the group consisting of benzophenone derivatives, thioxanethone derivatives, anthraquinone derivatives, acetophenones, benzoine ethers, and mixtures thereof.

6. The composite of claim 1, wherein at least one of the first or second color former is a leuco dye.

7. The composite of claim 6, wherein the leuco dye is independently selected from the group consisting of fluorans, phthalides, amino-triarylmethanes, aminoxanthenes, aminothioxanthenes, amino-9,10-dihydro-acridines, aminophenoxazines, aminophenothiazines, amino dihydro-phenazines, aminodiphenylmethanes, aminohydrocinnamic acids and corresponding esters, 2(p-hydroxyphenyl)-4,5-diphenylimidazoles, indanones, leuco indamines, hydrozines, leuco indigoid dyes, amino-2,3-dihydro anthraquinones, tetrahalo-p,p'-biphenols, 2(p-hydroxyphenyl)-4,5-diphenylimidazoles, phenethylanilines, and mixtures thereof.

8. The composite of claim 1, wherein at least one of the first or second developer is independently selected from the group consisting of 4,4'-dihydroxydiphenylsulfone, 4-hydroxy-4'-isopropoxydiphenyl sulfone, 4,4' thiobis(6-tert-butyl-3-methylphenol) and mixtures thereof.

9. The composite of claim 1, wherein the first extinction coefficient is at least 1.5 times higher than the second extinction coefficient.

10. The composite of claim 1, wherein the radiation absorber is present in both layers.

11. The composite of claim 10, wherein the radiation absorber is present in a higher quantity in one of the color forming layers.

12. The composite of claim 1, wherein the radiation absorber is present in only one of the first and second color forming layer.

13. The composite of claim 1, wherein the first layer has a first radiation absorber and the second layer has a different second radiation absorber.

14. The composite of claim 13, wherein the first radiation absorber and the second radiation absorber have different extinction coefficients.

15. The composite of claim 1, wherein the first color forming layer has a color that has a higher lightness coordinate, L*, in a CIELAB color space, than the second color former.

16. The composite of claim 1, wherein either the first color forming layer or the second color forming layer has a developer dissolved as a soluble phase in a polymer matrix and a color former that is dispersed as an insoluble phase in the polymer matrix.

17. The composite of claim 1, wherein either the first color forming layer or the second color forming layer has a color former dissolved as a soluble phase in a polymer matrix and a developer dispersed as an insoluble phase in the polymer matrix.

18. The composite of claim 1, wherein the second color forming layer is formulated to begin development prior to the first color forming layer, and wherein different levels of energy application to said composite facilitates various levels of development of both layers, thereby providing an ability to control color blending by modulating energy application.

19. A method of forming multi-colored images on a substrate, comprising:

a) providing a color forming layered composite coated on a substrate; said color forming layered composite, including:

i) a first color forming layer comprising a first polymer matrix, a first color former, and a first developer, wherein the first color former and the first developer are in separate phases within the first color forming layer;

ii) a second color forming layer comprising a second polymer matrix, a second color former, and a second developer, wherein the second color former and the second developer are in separate phases within the second color forming layer; and iii) at least one radiation absorber;

wherein the radiation absorber is present in at least one of the first or second color forming layers, said first color forming layer having a first extinction coefficient that is higher than a second extinction coefficient of said second color forming layer;

b) directing electromagnetic radiation from an electromagnetic radiation source onto a first portion of the color forming layered composite at a first wavelength and first power level for a sufficient amount of time to cause the radiation absorber to generate enough heat to at least partially develop at least one color former, thereby generating a colored image; and c) directing additional electromagnetic radiation from an electromagnetic radiation source onto a second portion of the color forming composite at a second wavelength or second power level for a sufficient amount of time to cause the radiation absorber to generate enough heat to develop the color forming layered composite in a manner that has a perceptibly different color than the colored image, thereby forming the multi-colored image.

20. The method of claim 19, wherein only the first color former is developed to form the colored image.

21. The method of claim 19, wherein the first and second color formers are developed to form the colored image.

22. The method of claim 19, wherein the first color former is developed and the second color former is partially developed to form the colored image.

23. The method of claim 19, wherein the color forming layered composite is applied by spin-coating, silk-screening, offset printing, ink-jet printing, gravure printing, roller coating, or spraying.

24. The method of claim 19, wherein the substrate is an optical disk.

* * * * *

UNITED STATES PATENT AND TRADEMARK OFFICE
CERTIFICATE OF CORRECTION

PATENT NO. : 7,575,844 B2
APPLICATION NO. : 11/796349
DATED : August 18, 2009
INVENTOR(S) : Vladek Kasperchik et al.

It is certified that error appears in the above-identified patent and that said Letters Patent is hereby corrected as shown below:

In column 6, line 1, delete "hydrozines," and insert -- hydrazines, --, therefor.

In column 17, line 51, in Claim 5, delete "thioxanethone" and insert -- thioxanthone --, therefor.

In column 17, lines 59-60, in Claim 7, delete "amino dihydro-phenazines," and insert -- aminodihydro-phenazines, --, therefor.

In column 17, line 62, in Claim 7, delete "hydrozines," and insert -- hydrazines, --, therefor.

In column 18, line 2, in Claim 8, delete "4,4' thiobis" and insert -- 4,4'-thiobis --, therefor.

Signed and Sealed this

Seventh Day of September, 2010

David J. Kappos
*Director of the United States Patent and Trademark Office*